United States Patent
Su et al.

(10) Patent No.: US 7,141,485 B2
(45) Date of Patent: Nov. 28, 2006

(54) SHALLOW TRENCH ISOLATION STRUCTURE WITH LOW SIDEWALL CAPACITANCE FOR HIGH SPEED INTEGRATED CIRCUITS

(75) Inventors: Ke-Wei Su, Shan-Hua (TW); Cheng Hsiao, Chiai (TW); Jaw-Kang Her, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/462,314

(22) Filed: Jun. 13, 2003

(65) Prior Publication Data

US 2004/0251513 A1   Dec. 16, 2004

(51) Int. Cl.
*H01L 21/76* (2006.01)

(52) U.S. Cl. .............. 438/424; 438/437; 438/443; 438/696; 438/702; 438/703; 438/761; 438/778; 438/787

(58) Field of Classification Search ................ 438/424, 438/435, 437, 631, 680, 694, 696, 700, 702, 438/703, 761, 778, 787, 791, 388, 395, 401, 438/443, FOR. 388, FOR. 395
See application file for complete search history.

(56) References Cited

U.S. PATENT DOCUMENTS

| | | | |
|---|---|---|---|
| 5,702,976 A | 12/1997 | Schuegraf et al. ............ 437/67 |
| 5,811,347 A | 9/1998 | Gardner et al. ............. 438/435 |
| 5,943,585 A | 8/1999 | May et al. .................. 438/400 |
| 6,087,705 A | 7/2000 | Gardner et al. ............. 257/510 |
| 6,107,187 A * | 8/2000 | Lao et al. .................... 438/633 |
| 6,140,691 A | 10/2000 | Gardner et al. ............. 257/506 |
| 6,172,395 B1 * | 1/2001 | Chen et al. .................. 257/315 |
| 6,344,415 B1 | 2/2002 | Chuang et al. ............. 438/692 |
| 6,380,066 B1 * | 4/2002 | See et al. .................... 438/624 |
| 6,436,808 B1 | 8/2002 | Ngo et al. .................. 438/623 |
| 6,570,213 B1 * | 5/2003 | Wu ............................. 257/315 |
| 6,593,210 B1 * | 7/2003 | Rangarajan et al. ........ 438/437 |
| 6,624,016 B1 * | 9/2003 | Wu ............................. 438/221 |
| 2001/0019152 A1 * | 9/2001 | Meguro ...................... 257/317 |
| 2002/0014677 A1 * | 2/2002 | Han et al. .................... 257/510 |

* cited by examiner

*Primary Examiner*—George R. Fourson
*Assistant Examiner*—Joannie Adelle Garcia
(74) *Attorney, Agent, or Firm*—Thomas, Kayden, Horstemeyer & Risley

(57) ABSTRACT

A method for reducing sidewall capacitance by 25% or more in an STI structure is described. A conformal barrier layer is deposited on sloped sidewalls in a shallow trench within a substrate. The trench is filled with a low k dielectric material which is planarized and etched back. Next a barrier cap layer is deposited that is different than the underlying low k dielectric layer. In one embodiment, the barrier cap layer is a SiCOH material that is modified for enhanced CMP performance that yields fewer surface scratches and defects. A nitride etch stop layer and a pad oxide are removed above an active area on the substrate to afford the final STI structure. Optionally, the barrier cap layer is omitted and the low k dielectric layer extends slightly above the substrate level. Total parasitic capacitance in the resulting MOS device is reduced by 15% or more.

36 Claims, 5 Drawing Sheets

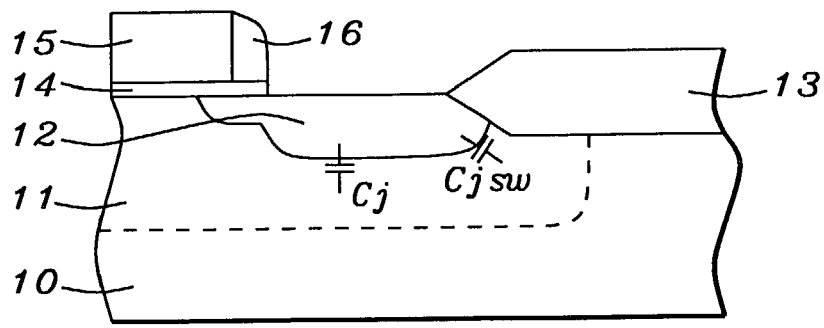
FIG. 1 - Prior Art
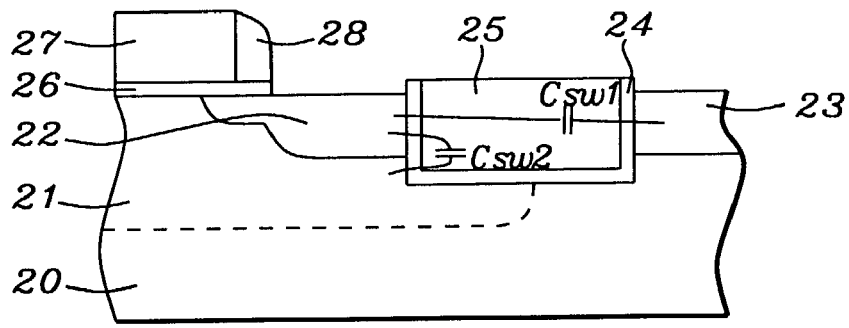
FIG. 2 - Prior Art
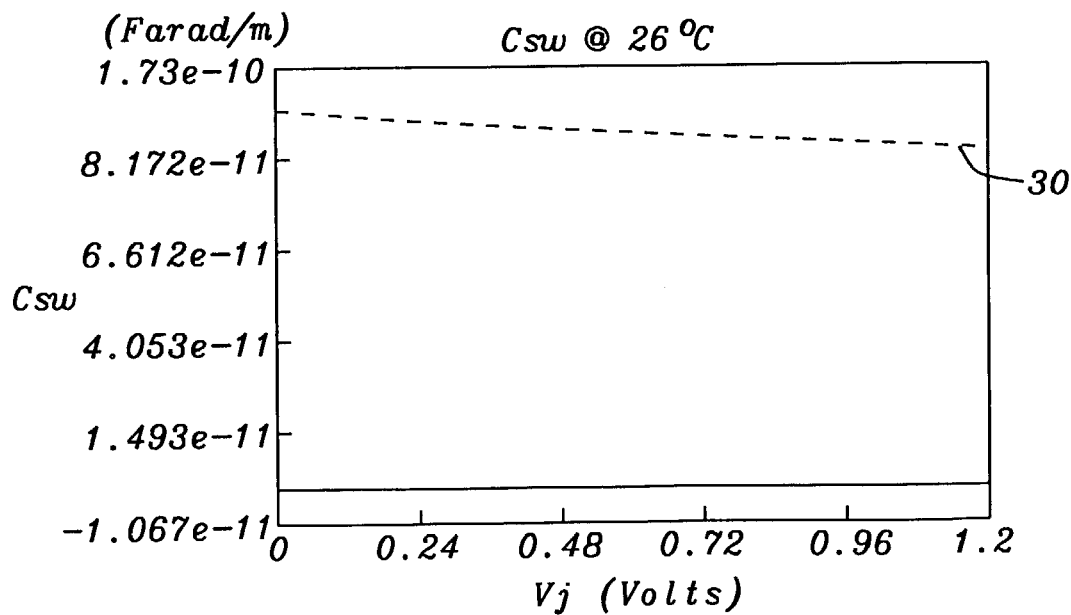
FIG. 3

SHALLOW TRENCH ISOLATION STRUCTURE WITH LOW SIDEWALL CAPACITANCE FOR HIGH SPEED INTEGRATED CIRCUITS

RELATED PATENT APPLICATION

This application is related to the following: Ser. No. 10/270,974, filing date Oct. 15, 2002.

FIELD OF THE INVENTION

The present invention relates to a method of fabricating an integrated circuit device. More particularly, the present invention relates to a method of forming a shallow trench isolation (STI) structure that reduces capacitance between neighboring devices.

BACKGROUND OF THE INVENTION

Integrated circuits in microelectronic devices are becoming smaller in order to provide higher performance for products requiring advanced technology. The integrated circuits are comprised of several layers which are individually formed with a unique pattern. In certain layers, shallow trench isolation (STI) structures are needed to separate areas where active devices are to be formed. The process typically involves forming a trench between areas where active devices will be located and filling the trench in a high density plasma (HDP) chemical vapor deposition (CVD) process with a dielectric material that will insulate neighboring devices and prevent unwanted "crosstalk" between wiring. Dielectric materials with a relatively high dielectric constant (k) such as silicon dioxide with a k value of about 4 are no longer acceptable. A dielectric material with a k value of 3.5 or less and preferably 3 or less is needed for STI structures that have sub-micron dimensions, especially those that have a width which is smaller than about 0.5 microns.

For metal-oxide-semiconductor (MOS) devices based on a local oxidation of silicon (LOCOS) technology as shown in FIG. 1, the parasitic capacitance includes a junction capacitance (Cj) and a sidewall capacitance (Cjsw). Substrate 10 is typically doped or undoped silicon. In this case, substrate 10 includes a well region 11 and a source/drain (S/D) region 12. A LOCOS oxide structure 13 is formed on one side of the S/D region 12. On the opposite side of the S/D region 12, a gate dielectric layer 14, a gate electrode 15, and a spacer 16 are illustrated. For the structure depicted in FIG. 1, the Cjsw is mainly attributed to the junction interface between S/D region 12 and well region 11. Cjsw is bias dependent because the depletion width near the junction interface will widen for higher junction voltage.

An improved isolation technology has been developed for trench widths of approximately 0.5 microns or less. The newer shallow trench isolation (STI) structure pictured in FIG. 2 comprises a substrate 20, a well region 21, a S/D region 22, and another device or well pick-up region 23. A STI feature containing a barrier liner 24 and a dielectric layer 25 is located adjacent to the S/D region 22. On the opposite side of the S/D region 22 is a gate dielectric layer 26 and a gate electrode 27 that has a sidewall spacer 28. It is believed that the sidewall capacitance across the material in the STI feature might be more significant than the depletion region around the junction interface between S/D region 22 and well region 21. In the STI structure, Csw1 refers to capacitance between neighboring devices while Csw2 is the edge capacitance between device (S/D region 22) and substrate 20.

The sidewall capacitance (Csw) which is equivalent to Csw1+Csw2 for the STI structure in FIG. 2 is plotted in FIG. 3 as a function of applied voltage. The measured Csw in (Farad/m) decreases slightly as voltage is increased. In this example, the voltage is monitored between the S/D region 22 (n+state) and a p-well 21. Region 23 represents a p+ pick-up. Note that Csw is nearly independent of voltage.

Sidewall capacitance is a very important factor to be reckoned with in advanced technology. As device integration is enhanced and STI width is reduced further, Csw will rise dramatically and thus degrade circuit speed. The illustration in FIG. 4 shows how sidewall capacitance increases by over 50% when reducing a STI width from 0.5 microns (curve 36), to 0.24 microns (curve 35). For common devices with small sizes in digital circuits, Csw might account for more than 50% of the total parasitic capacitance within the source and drain. Therefore, a new STI structure is needed to counteract this trend of increasing Csw.

In U.S. Pat. No. 5,702,976, a shallow trench that is less than 250 nm in depth to minimize parasitic interdevice currents and void formation is filled with a low k dielectric material which is preferably halide doped $SiO_2$. A barrier layer comprised of an oxide or nitride is deposited on the walls and bottom of the trench prior to filling with a low k dielectric material. No cap layer is included.

Low k dielectric layers such as carbon doped silicon oxide are porous and must be densified by a plasma treatment that also prevents moisture uptake. An example of a post-deposition treatment that stabilizes a low k dielectric film is found in U.S. Pat. No. 6,436,808 and involves a nitrogen plasma that can additional include $NH_3$. The plasma treatment is believed to form a thin skin of silicon nitride or silicon oxynitride having a thickness of about 20 to 50 Angstroms.

U.S. Pat. No. 6,140,691 describes a trench isolation structure that has a low k dielectric material totally encapsulated within an oxide liner in a trench. The dielectric material is preferably a fluorinated oxide or polymer. A channel stop dopant is implanted in the trench before the oxide liner is deposited. However, the trench is still comprised of a significant amount of oxide because of a relatively thick oxide cap.

AMD also teaches the use of a low k dielectric layer between an oxide liner and an oxide filler in a STI feature in U.S. Pat. No. 5,943,585. Here the percentage of low k material in the trench is less than the previous case. Similarly, the percentage of a low k dielectric material in a STI structure is minimal in U.S. Pat. No. 6,087,705 where the low k material is restricted to sidewall spacers at the edge of the trench structure.

In yet another variation of the AMD trench structure, a method is described in U.S. Pat. No. 5,811,347 for performing a nitrogen implant in an oxide liner. The nitrogen containing liner forms a stronger bond to the silicon sidewalls of the trench and ties up "dangling" silicon bonds that might otherwise contribute to a leakage current. The modified trench liner contains about 0.5 to 2% nitrogen.

Another method of forming an STI structure is described in U.S. Pat. No. 6,344,415. Trenches are formed by patterning a mask on an amorphous silicon layer that is deposited on a pad oxide layer. The pattern is etched through the α-Si layer and pad oxide into the substrate. Then the trench is filled with an oxide liner and an insulation material before a chemical mechanical polish (CMP) step planarizes the surface.

SUMMARY OF THE INVENTION

An objective of the present invention is to provide a method for forming an STI structure which has reduced sidewall capacitance for application in high speed integrated circuits.

Another objective of the present invention is to provide an STI method that will reduce the total parasitic capacitance in small devices.

A still further objective is to provide an STI structure for MOS devices that provides improved performance of integrated circuits with high integration density.

These objectives are accomplished by providing a substrate that may be doped or undoped silicon or a substrate based on another technology such as Si—Ge or Ga—As. A pad oxide is grown on the substrate followed by depositing a nitride layer. Next a photoresist is coated and patterned on the nitride layer to generate trench openings. The openings are etch transferred into the substrate and the remaining photoresist is stripped. The shallow trenches in the substrate have slightly sloped sidewalls. The sloped sidewalls provide a more favorable process window for filling the trenches with a dielectric material by a CVD technique without forming voids.

In one embodiment, a barrier layer is deposited to form a conformal layer in the trenches. Then a low k dielectric material with a dielectric constant below 3.9 and preferably below 3 is deposited to fill the trenches. A planarizing method such as a CMP step is performed to lower the level of the dielectric material until it is coplanar with the nitride layer. The low k dielectric material is etched back to a level that is about coplanar with the top of the substrate. Another layer consisting of barrier cap material is deposited on the substrate to encapsulate the low k dielectric material. In one embodiment, the barrier cap is comprised of silicon nitride, silicon oxynitride, or silicon carbide. In an alternative and preferred embodiment, the barrier cap is comprised of a low k dielectric material that is optimized for good etch stop properties that are required for a subsequent planarization step. For example, the low k dielectric material may be carbon doped silicon oxide also known as SiCOH that has an upper region enriched in Si—C bonds. A second CMP step follows to remove any barrier cap material above the nitride layer and to planarize the barrier cap layer to a level that is coplanar with the nitride layer. The planarized barrier cap layer comprised of SiCOH may be treated by a second plasma treatment according to known methods to densify the layer and prevent $H_2O$ absorption that would increase the dielectric constant.

The resulting structure is treated with phosphoric acid to remove the nitride layer. Next the pad oxide is stripped. Conventional methods are followed to complete a transistor between trenches and these steps include fabricating a gate electrode above a gate dielectric layer, adding sidewall spacers, forming lightly doped and heavily doped source/drain regions, and forming contacts to the gate electrode and to source/drain regions. When a low k dielectric material with a k value of 2.9 replaces a $SiO_2$ fill layer in the STI structure, the sidewall capacitance is reduced by 25%. Further improvement can be achieved with a low k dielectric material as the barrier cap layer.

In a second embodiment, trenches are formed in the substrate by the same process steps as mentioned in the first embodiment. A barrier layer is deposited to form a conformal layer within the trenches and on the nitride layer. Next, a low k dielectric layer is deposited on the conformal barrier layer so that it fills the trenches to a level above the nitride layer. The low k dielectric layer may be formed by a spin coating of a polymeric material or by a deposition using a CVD or plasma enhanced CVD technique. In a preferred example, the low k dielectric layer is a carbon doped silicon oxide whose surface is modified to make it more resistant to a CMP polish step and thereby avoid scratches that can lower device yield. A planarization step such as a CMP process lowers the level of the low k dielectric layer so that it is coplanar with the nitride layer. A densification and stabilization step of the remaining low k dielectric layer may be performed here by a plasma treatment step as in the first embodiment. The nitride layer and pad oxide are removed and a transistor is formed as described in the first embodiment. This embodiment is equally effective as the first embodiment in reducing sidewall capacitance when a low k dielectric layer is employed as a trench fill material.

This invention is also a STI structure comprised of a shallow trench with sloped sidewalls in a substrate, a conformal barrier layer within the trench, a low k dielectric material on the conformal barrier layer that fills the trench to a level that is about coplanar with the top of the substrate, and a barrier cap layer above the trench to encapsulate the low k dielectric material. In one embodiment, the barrier cap is comprised of silicon nitride, silicon oxynitride, or silicon carbide. In another embodiment, the barrier cap is comprised of a material that has good etch stop properties for a subsequent planarization step. For example, the barrier may be carbon doped silicon oxide (SiCOH) that is hardened towards a CMP step and has a lower dielectric constant than as deposited by a CVD method. In yet another embodiment, the barrier cap layer may be omitted and the low k dielectric material in the trench structure extends to a level that is about coplanar with the substrate or slightly above the substrate.

BRIEF DESCRIPTION OF THE DRAWINGS

The drawings are intended to provide a more thorough understanding of the invention. The drawings illustrate embodiments of the invention and together with the description serve to explain the principles of the present invention.

FIG. 1 is a cross-sectional drawing of a MOS transistor that is based on a LOCOS isolation technology.

FIG. 2 is cross-sectional drawing of a MOS transistor that is based on conventional STI technology.

FIG. 3 is a graph showing the relationship of measured sidewall capacitance in an STI structure as a function of an applied voltage from an n+ S/D region to a p-well.

DETAILED DESCRIPTION OF THE INVENTION

The present invention relates to a method of forming STI structures with low sidewall capacitance and having a width of less than about 0.5 microns that are used in fabricating a MOS device. The invention is also a shallow trench isolation structure with improved properties for isolating neighboring devices.

Figure 4:
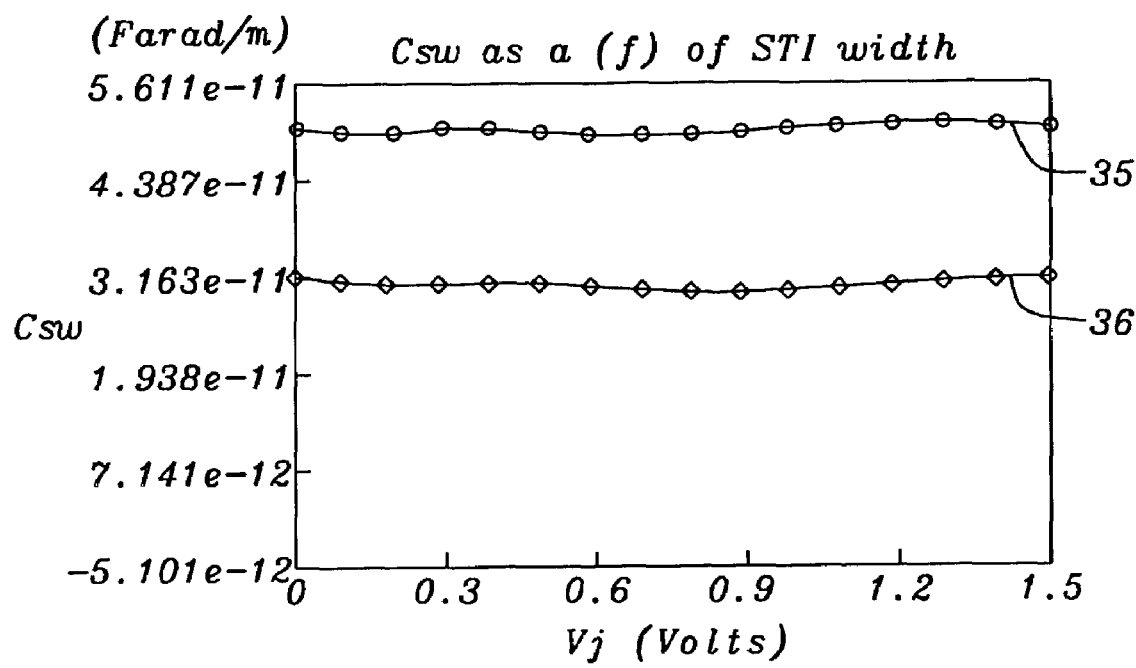
FIG. 4 is a graph showing the simulated sidewall capacitance in an STI structure as a function of applied voltage and in relation to the trench isolation width.
Figure 5:
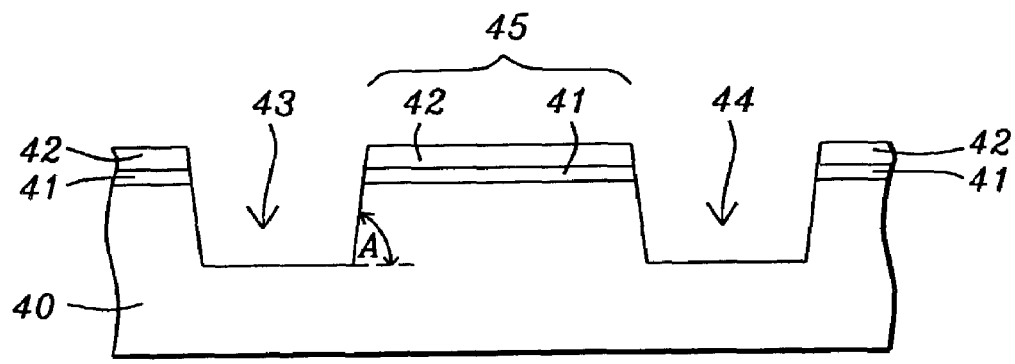
FIG. 5 is a cross-sectional drawing showing a shallow trench formed in a substrate according to a method of the present invention.

The invention will be described with reference to the drawings which are not necessarily drawn to scale. Referring to FIG. 5, a substrate 40 is provided that is typically silicon and which can be doped or undoped but may optionally be based on a silicon-germanium, gallium-arsenide, or silicon-on-insulator technology. Substrate 40 may contain a substructure (not shown) that includes active and passive devices. Trenches 43, 44 are fabricated by first depositing a pad oxide layer 41 on substrate 40. Pad oxide layer 41 may be thermally grown or deposited by a chemical vapor deposition (CVD) process. A silicon nitride layer 42 is then deposited by a CVD or plasma enhanced CVD (PECVD) method on pad oxide layer 41. The pad oxide layer 41 serves to reduce stress between silicon nitride layer 42 and substrate 40.

A photoresist layer (not shown) is coated and patterned to form openings that expose portions of silicon nitride layer 42. The photoresist pattern is next employed as an etch mask while the openings are transferred with a plasma etch process through the silicon nitride layer 42 and pad oxide layer 41 into substrate 40 to form trenches 43, 44. The remaining photoresist layer is stripped by a dry plasma or with a wet stripper. The etch process to form trenches 43, 44 preferably generates sloped sidewalls within substrate 40 that have an angle A of about 65° to 85° so that the width at the top of trenches 43, 44 is larger than the width at the base of the trenches. A sloped sidewall in an STI trench is believed to provide an advantage over vertical sidewalls in prior art by reducing the tendency for voids to form in a subsequent dielectric layer deposition that fills the trenches.

Figure 6:
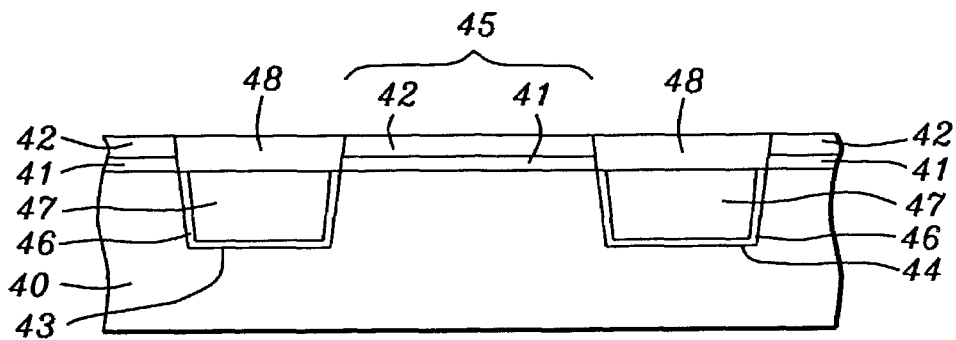
FIG. 6 is a cross-sectional view depicting the structure in FIG. 5 after a conformal barrier layer, a low k dielectric layer, and a barrier cap layer have been deposited.

Referring to FIG. 6, the region 45 is a partially formed transistor between trenches 43, 44. Transistor 45 will be completed after the trenches 43, 44 are filled. Returning to trenches 43, 44, a barrier layer 46 is deposited by a CVD or PECVD technique. The barrier layer 46 is comprised of silicon oxide, silicon nitride, or silicon oxynitride and forms a conformal layer within trenches 43, 44 and on silicon nitride layer 42. Optionally, barrier layer 46 may be a composite of two of the aforementioned materials in order to relieve stress between substrate 40 and barrier layer 46.

An important feature of this invention is that a low k dielectric layer 47 with a dielectric constant below 3.9 and preferably 2.9 or below is deposited on barrier layer 46 in trenches 43, 44. When an organic polymer material is employed as low k dielectric layer 47, a spin-on method is usually employed to coat the material and a bake step removes organic solvent to dry the film. In the example where the spin-on material is hydrogen silsesquioxane (HSQ) or methyl silsesquioxane (MSQ), a high temperature bake in the range of about 350° C. to 450° C. is needed to impart a low dielectric constant. When low k dielectric layer 47 is comprised of a doped oxide such as fluorine doped or carbon doped $SiO_2$, a CVD or PECVD method is used for deposition. Carbon doped $SiO_2$ is typically deposited from a mixture of an organosilane and an oxygen source gas and is also known as organosilicate glass (OSG) or SiCOH. SiCOH is available as Black Diamond™ from Applied Materials, as CORAL™ from Novellus, or as different trade names from other suppliers. Preferably, low k dielectric layer 47 when initially formed extends above the top of nitride layer 42 and is deposited in a manner so that no voids are formed within low k dielectric layer 47. Barrier layer 46 serves to prevent impurities in low k dielectric layer 47 from diffusing into substrate 40 and from contaminating the device which would degrade its performance.

Next, a planarization step is used to lower the level of low k dielectric layer 47 so that it is coplanar with the top of silicon nitride layer 42 which also functions as an etch stop. For example, a chemical mechanical polish (CMP) step may be used to planarize low k dielectric layer 47. Note that the barrier layer 46 which is on silicon nitride layer 42 is also removed by this planarization step.

The level of low k dielectric layer 47 is then reduced so that it is approximately coplanar with the top of substrate 40 by a conventional plasma etch back step or by treatment with a buffered HF solution. The level of conformal barrier layer 46 may also be lowered to be coplanar with that of low k dielectric layer 47 in this etch step. Optionally, barrier layer 46 remains in place and extends to a height that is above substrate 40. In either case, the substrate 40 including the surface of silicon nitride layer 42 and surface of low k dielectric layer 47 is cleaned by a conventional cleaning solution after the etch back step is complete.

Another key step in the method of this invention and a key feature of the STI structure is deposition of a barrier cap layer 48 by a CVD or PECVD process to fill trenches 43, 44 above the level of low k dielectric layer 47 and above the level of silicon nitride layer 42. In one embodiment, the barrier cap layer 48 is comprised of silicon nitride, silicon oxynitride, or silicon carbide. In another embodiment which is preferred, the barrier cap layer 48 is a low k dielectric material with a k value of less than 3.9 and preferably below 3 and which is different than low k dielectric layer 47. Then the dielectric constant for the combined layers 47, 48 within trenches 43, 44 is lower than in prior art methods where a $SiO_2$ barrier cap is formed over a low k dielectric fill material. For example, the barrier cap layer 48 may be comprised of a carbon doped oxide with a formula $SiO_XC_YH_Z$ hereafter referred to as SiCOH which is known to those skilled in the art. The barrier cap layer 48 serves to protect low k dielectric layer 47 during subsequent processing steps.

When SiCOH is employed as barrier cap layer 48, then the properties of cap layer 48 may be modified by a hydrocarbon and $H_2$ plasma treatment that converts some of the Si—O bonds to Si—C or Si—H bonds as described in related application TS01-1654 which is herein incorporated by reference. As a result, the dielectric constant may be adjusted lower. Conversion of some Si—O bonds to Si—C bonds in a surface region of barrier cap layer 48 improves the resistance to a subsequent CMP polish step so that the modified upper region of layer 48 approximates a SiC layer. A lower polish rate is an advantage since it reduces the tendency of forming scratches on the surface of barrier cap layer 48. These scratches are defects that can potentially extend through barrier cap layer 48 and into low k dielectric layer 47. The barrier cap layer 48 is planarized to become coplanar with the nitride layer 42. For instance, a CMP step may be employed to planarize barrier cap layer 48. Depending on the conditions of the hydrocarbon plasma treatment, a second plasma treatment may be required to stabilize and densify barrier cap layer 48 for subsequent process steps. For example, a nitrogen plasma treatment to modify a SiCOH layer is familiar to those skilled in the art.

Figure 7:
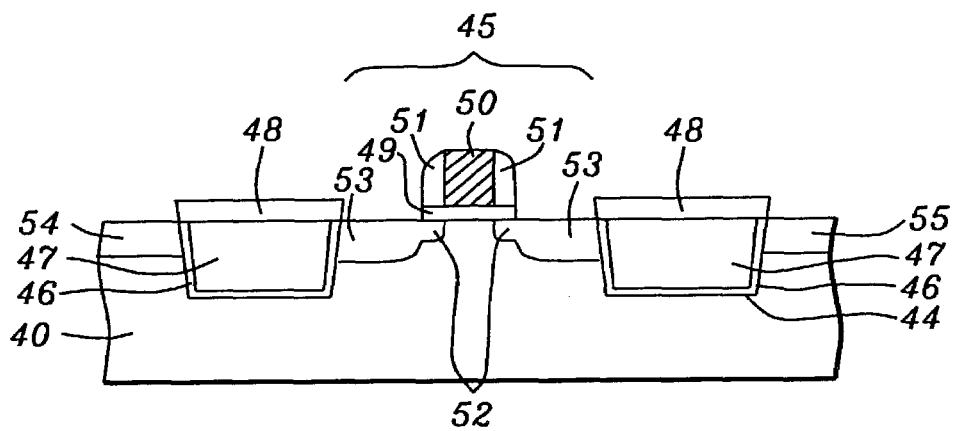
FIG. 7 is a cross-sectional view depicting the structure in FIG. 6 after a transistor is fabricated between two STI structures according to a method of this invention.

Referring to FIG. 7, silicon nitride layer 42 is removed by a conventional method such as treatment with a phosphoric acid solution. Pad oxide layer 41 is stripped by dipping substrate 40 in a buffered HF solution. The process that removes pad oxide layer 41 may also slightly lower the thickness of barrier cap layer 48. In one embodiment, the portion of barrier layer 46 which extends above the substrate 40 remains in place after the steps to remove pad oxide layer 41 and silicon nitride layer 42. Optionally, the portion of barrier layer 46 above the substrate is removed during the steps to strip pad oxide 41 and silicon nitride layer 42.

At this point a transistor 45 is fabricated on substrate 40 between trenches 43, 44. The transistor 45 is comprised of a gate dielectric layer 49, a gate electrode 50, sidewall spacers 51, lightly doped source/drain (S/D) regions 52, and heavily doped S/D regions 53. The transistor 45 may be further comprised of silicide regions (not shown) formed over the gate electrode 50 and on heavily doped S/D regions 53 and may include contacts (not shown) to the aforementioned silicide regions. Regions 54, 55 are heavily doped S/D regions in neighboring devices.

Figure 8:
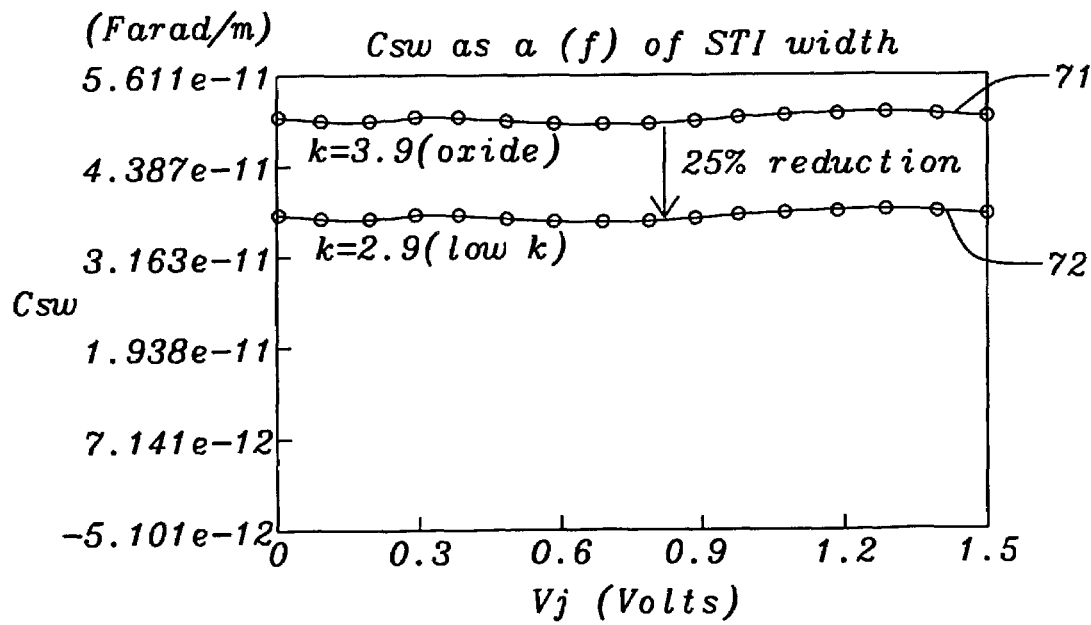
FIG. 8 is a drawing that illustrates how sidewall capacitance decreases when the dielectric constant of the dielectric material in the STI trench is reduced.

Referring to FIG. 8, the sidewall capacitance (Csw) of the STI structures comprised of barrier layer 46, low k dielectric layer 47, and barrier cap layer 48 in trenches 43, 44 bordering the transistor 45 depicted in FIG. 7 is simulated. A 25% reduction in Csw is observed by replacing a conventional oxide dielectric material in layer 47 that has a k=3.9 (curve 71) with a low k dielectric material (curve 72) having a k value of 2.9. An even greater improvement in Csw (not shown) would be realized by replacing the material in the barrier cap layer 48 with a low k dielectric material such as SiCOH. Furthermore, the SiCOH material can be modified to adjust its k value downward and its CMP polish rate lower to provide additional benefits such as reduced scratches from the polishing step that will lead to a higher device yield. Moreover, application of this method in forming MOS transistors will reduce the total parasitic capacitance in the resulting device. This STI structure is especially useful in improving the performance of high speed MOS devices that are based on STI widths of less than 0.5 microns.

Figure 9:
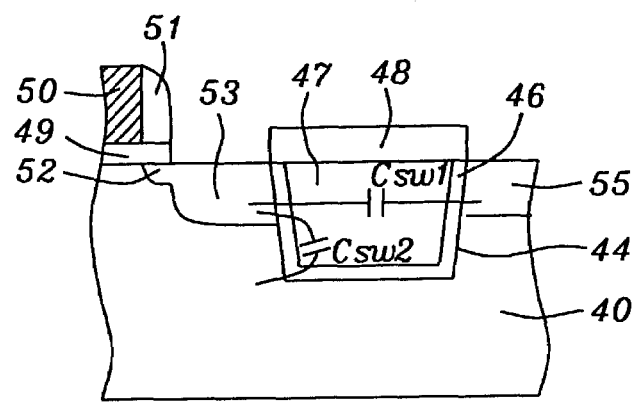
FIG. 9 is a cross-sectional view showing the paths for cross capacitance and fringing capacitance that contribute to sidewall capacitance in an STI structure.

Referring to FIG. 9, a portion of the device in FIG. 7 is shown to indicate pathways for cross capacitance (Csw1) and fringing capacitance (Csw2) to occur. Both Csw1 and Csw2 contribute to total sidewall capacitance (Csw). The dimensions of trenches 43, 44 could also be modified to minimize the Csw1 and Csw2. The inventors have found that sidewall capacitance of the STI structures in this invention is nearly insensitive to bias voltage and Csw is mainly attributed to the electric field in the barrier layer 46, low k dielectric layer 47, and barrier cap layer 48 in trenches 43, 44. Therefore, by optimizing the content of a low k dielectric layer in the trench and by reducing the k value of said layer to 2.9 or less, the Csw is minimized to a level not achieved by prior art methods. The method and STI structure of this invention can reduce the total parasitic capacitance in small devices by up to 15% or more.

In a second embodiment, the low k dielectric layer employed as a trench fill in a STI structure also replaces the function of the barrier cap material described in the first embodiment. A second embodiment is illustrated in FIGS. 10–13.

Figure 10:
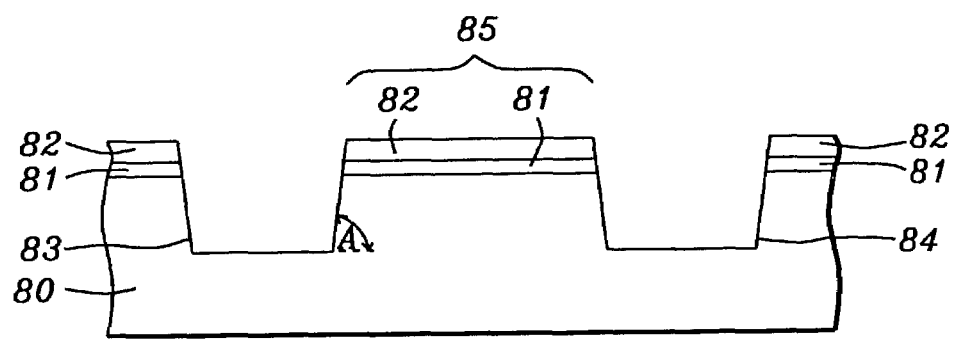
FIGS. 10–13 are cross-sectional views of an improved STI structure formed according to a second embodiment of the present invention.

Referring to FIG. 10, a substrate 80 that is typically silicon is provided which may be doped or undoped but can optionally be based on a silicon-germanium, gallium-arsenide, or silicon-on-insulator technology. Substrate 80 may contain a substructure (not shown) that includes active and passive devices.

Trenches 83, 84 are fabricated by first depositing a pad oxide layer 81 on substrate 80. Pad oxide layer 81 may be thermally grown or deposited by a CVD process. A silicon nitride layer 82 is then deposited by a CVD or PECVD method on pad oxide 81. The pad oxide layer 81 serves to reduce stress between silicon nitride layer 82 and substrate 80.

A photoresist layer (not shown) is coated and patterned to form openings that expose portions of silicon nitride layer 82. The photoresist pattern is next employed as an etch mask while the openings are transferred with a plasma etch process through the silicon nitride layer 82 and pad oxide layer 81 into substrate 80 to form trenches 83, 84. The remaining photoresist layer is stripped by a dry plasma or with a wet stripper. The etch process to form trenches 83, 84 preferably generates sloped sidewalls within the silicon substrate. The sidewalls have an angle A of about 65° to 85° so that the width at the top of trenches 83, 84 is larger than the width at the base of the trenches. A sloped sidewall in an STI trench is believed to provide an advantage over vertical sidewalls in prior art by reducing the tendency for voids to form in a subsequent dielectric layer deposition that fills the trenches.

Figure 11:
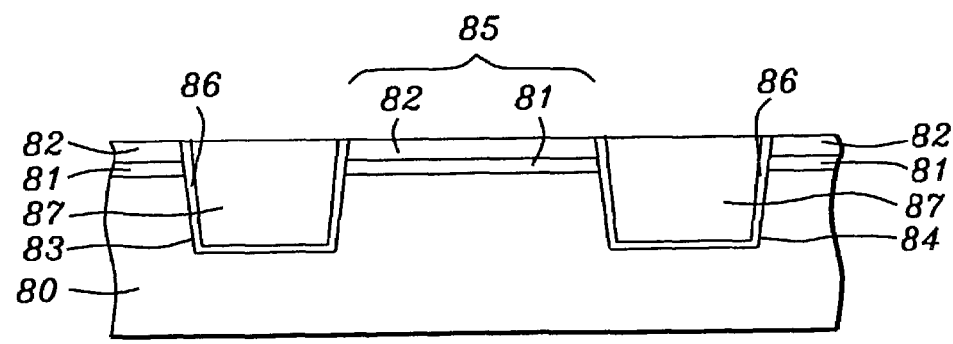

Referring to FIG. 11, the region 85 is a partially formed transistor between trenches 83, 84. Transistor 85 will be fabricated after the trenches 83, 84 are filled. Returning to trenches 83, 84, a barrier layer 86 is deposited by a CVD or PECVD technique. The barrier layer 86 is comprised of silicon oxide, silicon nitride, or silicon oxynitride and forms a conformal layer within trenches 83, 84 and on silicon nitride layer 82. Optionally, barrier layer 86 may be a composite of two of the aforementioned materials in order to relieve stress between substrate 80 and barrier layer 86.

An important feature of this invention is that a low k dielectric layer 87 with a dielectric constant below 3.9 and preferably 2.9 or below is deposited in trenches 83, 84. When an organic polymer material is employed as low k dielectric layer 87, a spin-on method is usually employed to coat the material and a bake step removes organic solvent to dry the film. In the example where the spin-on material is hydrogen silsesquioxane (HSQ) or methyl silsesquioxane (MSQ), a high temperature bake in the range of about 350° C. to 450° C. is needed to impart a low dielectric constant. When low k dielectric layer 87 is comprised of a doped oxide such as fluorine doped or carbon doped $SiO_2$ (SiCOH), a CVD or PECVD method is used for deposition. SiCOH is available as Black Diamond™ from Applied Materials, as CORAL™ from Novellus, or as different trade names from other suppliers. Preferably, low k dielectric layer 87 when initially formed extends above the top of silicon nitride layer 82 and is deposited in a manner so that no voids are formed within low k dielectric layer 87. Barrier layer 86 serves to prevent impurities in low k dielectric layer 87 from diffusing into substrate 80 and contaminating the device.

Next, a planarization step is used to lower the level of dielectric layer 87 so that it is coplanar with the top of silicon nitride layer 82 which also functions as an etch stop. For example, a CMP step may be used to planarize low k dielectric layer 87. Note that the barrier layer 86 which is on nitride layer 82 is also removed by this planarization step.

When the low k dielectric layer 87 extends above the level of substrate 80 and is coplanar with silicon nitride layer 82, then the dielectric constant for the combined layers 86, 87 within trenches 83, 84 is lower than in prior art methods where a SiO$_2$ barrier cap is formed over a low k dielectric that fills STI trenches only up to the substrate level. For example, the low k dielectric layer 87 may be comprised of a carbon doped oxide (SiCOH).

When SiCOH is employed as low k dielectric layer 87, then the properties of layer 87 may be modified by a hydrocarbon and H$_2$ plasma treatment that converts some of the Si—O bonds to Si—C or Si—H bonds as described in the first embodiment. As a result, the dielectric constant may be adjusted lower. Conversion of some Si—O bonds to Si—C bonds in a surface region of low k dielectric layer 87 improves the resistance to a subsequent CMP polish step so that the modified upper region of low k dielectric layer 87 approximates a SiC layer. A lower polish rate is an advantage because it reduces the tendency of forming scratches on the surface of low k dielectric layer 87. These scratches are considered defects since they can degrade device performance. Depending on the conditions of the hydrocarbon plasma treatment, a second plasma treatment may be required to stabilize and densify low k dielectric layer 87 for subsequent process steps. For example, a nitrogen plasma treatment to modify a SiCOH layer is familiar to those skilled in the art.

Figure 12:
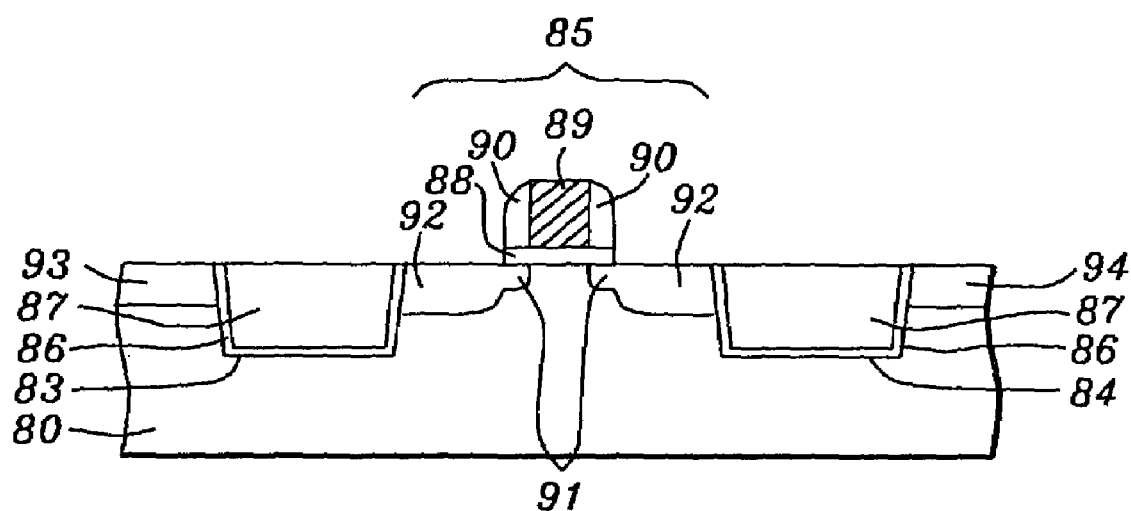

Referring to FIG. 12, silicon nitride layer 82 is removed by a conventional method such as treatment with a phosphoric acid solution. Pad oxide layer 81 is stripped by dipping substrate 80 in a buffered HF solution. The process that removes pad oxide layer 81 may also slightly lower the thickness of low k dielectric layer 87. In one embodiment, the barrier layer 86 which extends above the substrate remains in place after the steps to remove pad oxide layer 81 and silicon nitride layer 82. Optionally, the portion of barrier layer above the substrate is removed during the steps to strip pad oxide 81 and silicon nitride layer 82. In general, as the extension of low k dielectric layer 87 increases above the surface of substrate 80, the Csw is reduced further.

At this point a transistor 85 is fabricated on substrate 80 between trenches 83, 84. The transistor 85 is comprised of a gate dielectric layer 88, a gate electrode 89, sidewall spacers 90, lightly doped source/drain (S/D) regions 91, and heavily doped S/D regions 92. The transistor 85 may be further comprised of silicide regions (not shown) formed over the gate electrode 89 and on heavily doped S/D regions 92 and may include contacts (not shown) to the aforementioned silicide regions. Regions 93, 94 are heavily doped S/D regions in neighboring devices.

Referring to FIG. 8, the sidewall capacitance (Csw) of the STI structure described in the first embodiment is simulated and indicates a 25% reduction in Csw by replacing a conventional oxide dielectric material (curve 71) in a trench with a low k dielectric material (curve 72) having a k value of 2.9. This plot assumes that a conformal barrier layer and a barrier cap layer also have a dielectric constant of about 3.9. An even greater improvement in Csw (not shown) would be realized by removing the barrier cap layer and extending a low k dielectric layer above the substrate as depicted in the second embodiment. Furthermore, by employing a low k dielectric material such as SiCOH, the k value can be adjusted further downward by modifying the SiCOH layer with a plasma treatment as described in related application Ser. No. 10/270,974, filed Oct. 15, 2002, herein incorporated by reference. As a result of the plasma treatment, the CMP polish rate of the SiCOH layer can be reduced to prevent scratching during a planarization step. Therefore, implementation of the second embodiment will not only lower sidewall capacitance in the resulting MOS device but will also provide higher yields because of fewer defects associated with STI fabrication. Moreover, application of this method in forming MOS transistors will reduce the total parasitic capacitance in the resulting device. This STI structure is especially useful in improving the performance of high speed MOS devices that have STI widths of less than 0.5 microns.

Figure 13:
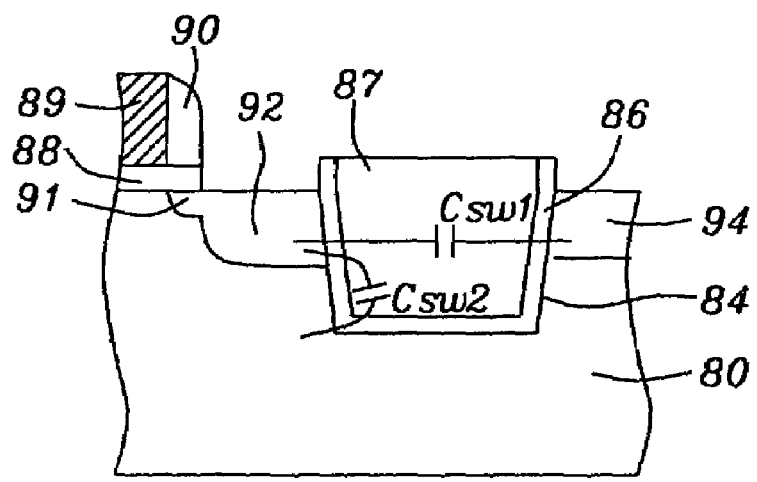

Referring to FIG. 13, a portion of the device in FIG. 12 is shown to indicate pathways for cross capacitance (Csw1) and fringing capacitance (Csw2) to occur. Both Csw1 and Csw2 contribute to total sidewall capacitance (Csw). The dimensions of trenches 83, 84 could also be modified to minimize the Csw1 and Csw2. The inventors have found that sidewall capacitance of the STI structures in this invention are nearly insensitive to bias voltage and Csw is mainly attributed to the electric field in the barrier layer 86 and low k dielectric layer 87 in trenches 83, 84. Therefore, by optimizing the content of a low k dielectric layer in the trench and by reducing the k value of said layer to 2.9 or less, the Csw is minimized to a level not achieved by prior art methods. The method and STI structure of this invention can reduce the total parasitic capacitance in small devices by up to 15% or more.

While this invention has been particularly shown and described with reference to, the preferred embodiments thereof, it will be understood by those skilled in the art that various changes in form and details may be made without departing from the spirit and scope of this invention.

We claim:

1. A method of forming a shallow trench isolation structure, said method comprising:
   providing a substrate having a shallow trench formed therein;
   depositing a conformal barrier layer within said shallow trench;
   filling said shallow trench with a low k dielectric layer;
   planarizing said low k dielectric layer, stopping on said substrate;
   etching back the planarized low k dielectric layer to a lower level in said shallow trench;
   depositing a barrier cap layer; and
   planarizing said barrier cap layer to a level above said substrate.

2. The method of claim 1 wherein said shallow trench has sloped sidewalls and is wider at the top than at the bottom.

3. The method of claim 1 wherein said conformal barrier layer is comprised of silicon oxide, silicon nitride, or silicon oxynitride.

4. The method of claim 1 wherein said conformal barrier layer is composite of two layers.

5. The method of claim 1 wherein said low k dielectric material has a dielectric constant of 2.9 or less.

6. The method of claim 1 wherein said low k dielectric material is deposited by a chemical vapor deposition (CVD), plasma enhanced CVD (PECVD) or by a spin-on process.

7. The method of claim 1 said low k dielectric layer is planarized by a chemical mechanical polish (CMP) step.

8. The method of claim 1 wherein said etching back step is performed with a plasma etch or with a buffered HF dip.

9. The method of claim 1 wherein said barrier cap material is comprised of silicon nitride, silicon oxynitride or silicon carbide.

10. The method of claim 1 wherein said barrier cap material is comprised of a low k dielectric material.

11. The method of claim 10 wherein said low k dielectric material is comprised of a carbon doped oxide referred to as SiCOH.

12. The method of claim 11 wherein said SiCOH material in said barrier cap layer is modified with a plasma treatment to provide a dielectric constant below 2.9.

13. The method of claim 11 wherein said SiCOH material in said barrier cap layer is modified with a plasma treatment to reduce its polish rate in a CMP process.

14. The method of claim 11 further comprised of performing a second plasma treatment on said SiCOH layer after said barrier cap layer planarization in order to densify and stabilize said SiCOH layer.

15. A method of forming a shallow trench isolation structure, said method comprising:
   providing a substrate having a stack comprised of an upper silicon nitride layer and a lower pad oxide layer formed thereon;
   forming a shallow trench that extends through said stack and into said substrate;
   depositing a conformal barrier layer on said substrate and within said shallow trench;
   filling said shallow trench with a low k dielectric layer;
   planarizing said low k dielectric layer, stopping on said silicon nitride layer;
   etching back the planarized low k dielectric layer to a lower level in said shallow trench;
   depositing a barrier cap layer;
   planarizing said barrier cap layer, stopping on said silicon nitride layer; and
   removing said silicon nitride and pad oxide layers.

16. The method of claim 15 wherein said shallow trench has sloped sidewalls and is wider at the top than at the bottom.

17. The method of claim 15 wherein said conformal barrier layer is comprised of silicon oxide, silicon nitride, or silicon oxynitride.

18. The method of claim 15 wherein said conformal barrier layer is composite of two dielectric materials selected from the group of silicon oxide, silicon nitride or silicon oxynitride.

19. The method of claim 15 wherein said low k dielectric material has a dielectric constant of 2.9 or less.

20. The method of claim 15 said low k dielectric layer is planarized by a chemical mechanical polish (CMP) step.

21. The method of claim 15 wherein said etching back step is performed with a plasma etch or with a buffered HP dip.

22. The method of claim 15 wherein said barrier cap material is comprised of silicon nitride, silicon oxynitride or silicon carbide.

23. The method of claim 15 wherein said barrier cap material is comprised of a low k dielectric material.

24. The method of claim 23 wherein said low k dielectric material is comprised of a carbon doped oxide referred to as SiCOH.

25. The method of claim 24 wherein said SiCOH material in said barrier cap layer is modified with a plasma treatment to provide a dielectric constant below 2.9.

26. The method of claim 24 wherein said SiCOH material in said barrier cap layer is modified with a plasma treatment to reduce its polish rate in a CMP process.

27. The method of claim 23 further comprised of performing a second plasma treatment on said SiCOH layer after said baffler cap layer planarization in order to densify and stabilize said SiCOH layer.

28. A method of forming a shallow trench isolation structure, said method comprising:
   providing a substrate having a stack comprised of an upper silicon nitride layer and a lower pad oxide layer formed thereon;
   forming a shallow trench that extends through said stack and into said substrate;
   depositing a conformal barrier layer within said shallow trench, wherein said conformal barrier layer is a composite comprised two dielectric materials selected from the group of silicon oxide, silicon nitride or silicon oxynitride;
   filling said shallow trench with a low k dielectric layer;
   planarizing said low k dielectric layer, stopping on said silicon nitride layer; and
   removing said silicon nitride and pad oxide layers.

29. The method of claim 28 wherein said shallow trench has sloped sidewalls and is wider at the top than at the bottom.

30. The method of claim 28 wherein said conformal barrier layer is comprised of silicon oxide, silicon nitride, or silicon oxynitride.

31. The method of claim 28 wherein said low k dielectric material has a dielectric constant of 2.9 or less.

32. The method of claim 28 said low k dielectric layer is planarized by a chemical mechanical polish (CMP) step.

33. The method of claim 28 wherein said low k dielectric material is comprised of a carbon doped oxide referred to as SiCOH.

34. The method of claim 33 wherein said SiCOH material is modified with a plasma treatment to provide a dielectric constant below 2.9.

35. The method of claim 33 wherein said SiCOH material is modified with a plasma treatment to reduce its polish rate in a CMP process.

36. The method of claim 33 further comprised of performing a second plasma treatment on said SiCOH layer after said baffler cap layer planarization in order to densify and stabilize said SiCOH layer.

* * * * *